(12) United States Patent
Eo et al.

(10) Patent No.: US 11,469,393 B2
(45) Date of Patent: Oct. 11, 2022

(54) DISPLAY DEVICE

(71) Applicant: Samsung Display Co., LTD., Yongin-si (KR)

(72) Inventors: Sung Woo Eo, Hwaseong-si (KR); Boyun Kim, Suwon-si (KR); Ji Young Wang, Hwaseong-si (KR)

(73) Assignee: Samsung Display Co., LTD., Yongin-si (KR)

( * ) Notice: Subject to any disclaimer, the term of this patent is extended or adjusted under 35 U.S.C. 154(b) by 188 days.

(21) Appl. No.: 17/033,706

(22) Filed: Sep. 26, 2020

(65) Prior Publication Data
US 2021/0119170 A1    Apr. 22, 2021

(30) Foreign Application Priority Data

Oct. 18, 2019   (KR) .......................... 10-2019-0130105

(51) Int. Cl.
*H01L 27/32*   (2006.01)
*H01L 51/52*   (2006.01)

(52) U.S. Cl.
CPC ...... *H01L 51/5237* (2013.01); *H01L 27/3244* (2013.01); *H01L 51/529* (2013.01); *H01L 51/5256* (2013.01); *H01L 51/5293* (2013.01)

(58) Field of Classification Search
CPC ............. H01L 51/5237; H01L 27/3244; H01L 51/5256; H01L 51/5284; H01L 2251/5338; H01L 2251/558; H01L 27/3225; G09F 9/301
See application file for complete search history.

(56) References Cited

U.S. PATENT DOCUMENTS 10,600,991 B2    3/2020  Kwon et al.
2018/0349719 A1*  12/2018  Lius .................. G02F 1/133514

FOREIGN PATENT DOCUMENTS

KR    10-2019-0027409    3/2019

\* cited by examiner

*Primary Examiner* — Donald L Raleigh
(74) *Attorney, Agent, or Firm* — H.C. Park & Associates, PLC

(57) ABSTRACT

A display device including a display module including a display area from which an image is displayed and a hole area disposed inside the display area, and a window disposed on the display module and including a first window area overlaying the hole area and a second window area overlapping the display area, wherein a first thickness of the first window area may be greater than a second thickness of the second window area.

20 Claims, 7 Drawing Sheets

DISPLAY DEVICE

CROSS REFERENCE TO RELATED APPLICATION

This application claims priority from and the benefit of Korean Patent Application No. 10-2019-0130105, filed on Oct. 18, 2019, which is hereby incorporated by reference for all purposes as if fully set forth herein.

FIELD

Exemplary embodiments relate generally to an electronic device and, more specifically, to a display device having a window.

DISCUSSION OF THE BACKGROUND

A display device may include a display panel configured to display an image and a transparent window that covers a display surface of the display panel. The window may generally protect the display panel from external impact, scratch, or the like.

Research on flexible display devices such as a foldable display devices, rollable display devices, and the like, is actively being conducted. Windows applied to flexible display devices may be flexible as well as robust to external impact.

The above information disclosed in this Background section is only for understanding of the background of the inventive concepts, and, therefore, it may contain information that does not constitute prior art.

SUMMARY

Embodiments provide a display device including a window having an improved impact resistance.

Additional features of the inventive concepts will be set forth in the description which follows, and in part will be apparent from the description, or may be learned by practice of the inventive concepts.

A display device according to exemplary embodiments may include a display module including a display area from which an image is displayed and a hole area disposed inside the display area, and a window disposed on the display module and including a first window area overlaying the hole area and a second window area overlapping the display area, wherein a first thickness of the first window area may be greater than a second thickness of the second window area.

The display area may surround the hole area.

The first thickness may be less than about 400 μm.

The second thickness may be from about 10 μm to about 100 μm.

The window may include glass.

The second window area may be bendable.

A width of the first window area may be less than a width of the hole area of the display module.

The display device may further include a light shielding layer disposed between the display module and the window and at a boundary between the display area and the hole area.

The display device may further include a functional module disposed under the first window area and spaced apart from the window.

The display device may further include a first impact absorbing layer disposed under the first window area.

The first impact absorbing layer may include at least one of glass, polyethylene terephthalate (PET), polyimide (PI), polymethyl methacrylate (PMMA), and polycarbonate (PC).

The display device may further include a second impact absorbing layer disposed between the second window area and the display module.

The second impact absorbing layer may include a material same as that of the first impact absorbing layer.

The display device may further include a light shielding layer disposed between the display module and the second impact absorbing layer and at a boundary between the display area and the hole area.

The display module may include a display panel and a polarization layer disposed between the display panel and the window.

The display module may further include a heat dissipation layer disposed under the display panel and a cushion layer disposed between the heat dissipation layer and the display panel.

The display module may further include a protective layer disposed between the display panel and the cushion layer.

Exemplary embodiments may also include a display device including a display module that has a display area from which an image is displayed and a hole area disposed inside the display area, and a window disposed on the display module and including a flat portion having a uniform thickness and a protruding portion protruding from the flat portion toward the hole area of the display module.

A thickness of the protruding portion may be less than a thickness of the display module.

A width of the protruding portion of the window may be less than a width of the hole area of the display module.

The display device according to exemplary embodiments may include a window in which a thickness of a first portion of the window corresponding to the hole area of the display module is greater than a thickness of a second portion of the window corresponding to the display area of the display module, therefore, the impact resistance of the window may be improved.

It is to be understood that both the foregoing general description and the following detailed description are exemplary and explanatory and are intended to provide further explanation of the invention as claimed.

BRIEF DESCRIPTION OF THE DRAWINGS

Illustrative, non-limiting embodiments will be more clearly understood from the following detailed description taken in conjunction with the accompanying drawings.

DETAILED DESCRIPTION OF THE ILLUSTRATED EMBODIMENTS

Figure 1:
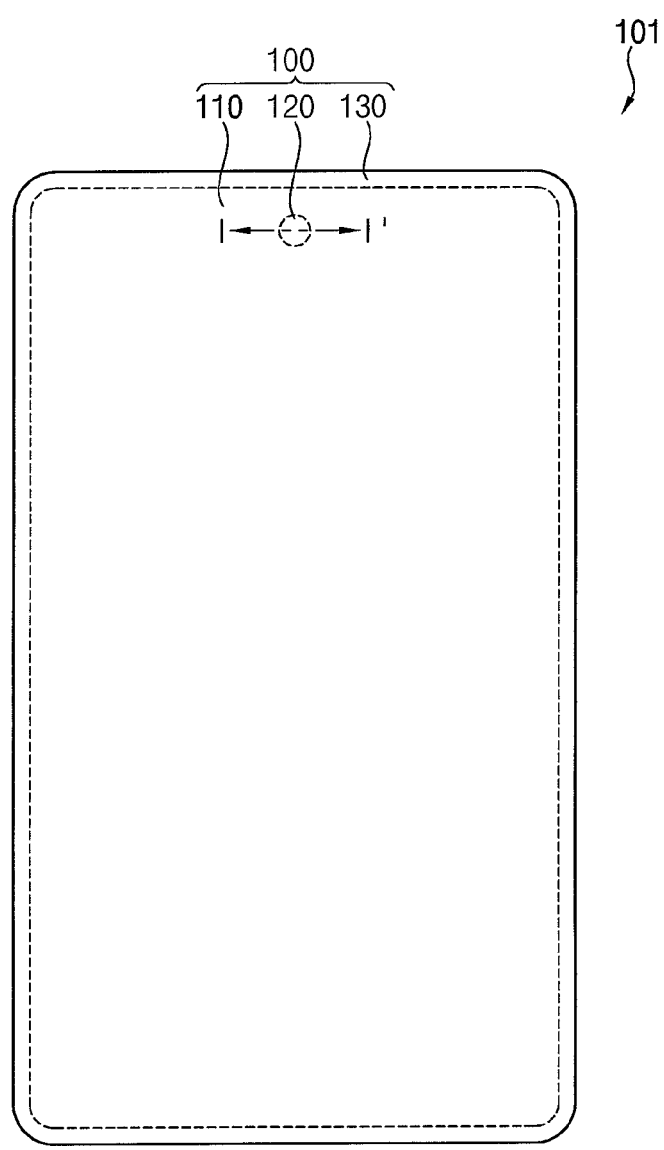
FIG. 1 is a plan view illustrating a display device according to embodiments described herein.

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are illustrated in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Hereinafter, display devices in accordance with embodiments will be explained in detail with reference to the accompanying drawings.

A display device 101 according to embodiments described herein will be described with reference to FIGS. 1 to 4.

Figure 2:
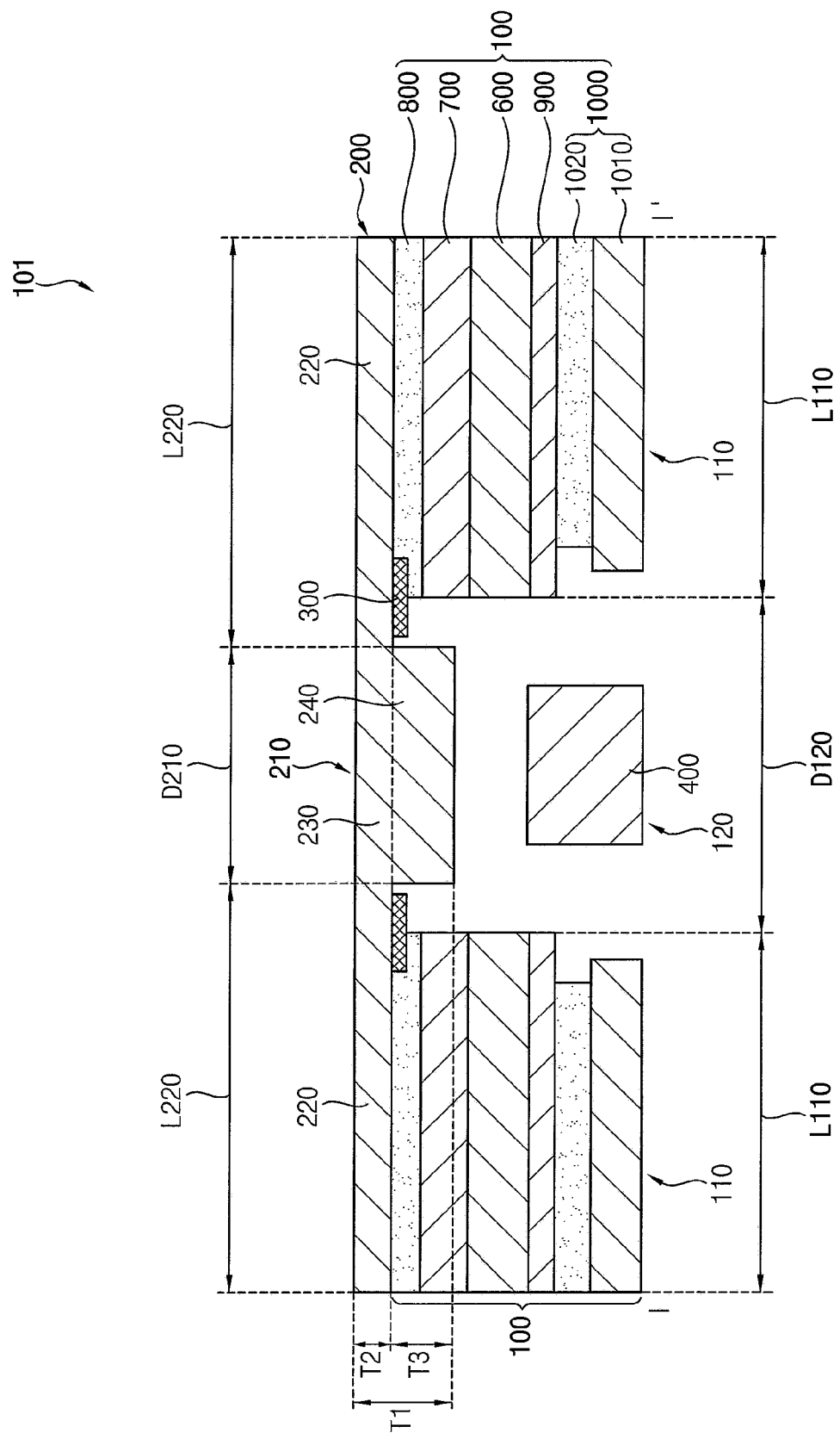
FIG. 2 is a cross-sectional view illustrating a portion of a display device according to embodiments described herein.

FIG. 1 is a plan view illustrating a display device 101 according to example embodiments. FIG. 2 is a cross-sectional view illustrating a portion of the display device 101 according to embodiments described herein. For example, FIG. 2 may be a cross-sectional view taken along a line I-I' in FIG. 1.

Referring to FIGS. 1 and 2, a portion of display device 101 according to embodiments described herein may include a display module 100, a window 200, a light shielding layer 300, and a functional module 400.

The display module 100 may include a display area 110, a hole area 120, and a peripheral area 130. In other words, the display module 100 may be divided into the display area 110, the hole area 120, and the peripheral area 130 in plan view and cross-sectional view.

The display area 110 may be an area from which an image is displayed. The display module 100 may display an image through the display area 110. In an embodiment, the display area 110 may have a substantially quadrangular shape in a plan view. However, the present invention is not limited thereto, and in another embodiment, the display area 110 may have various planar shape such as a circular shape, a polygonal shape, or the like.

The hole area 120 may be disposed inside the display area 110. In other words, the display area 110 may surround the hole area 120. For example, the hole area 120 may be formed by forming an opening passing through the display module 100. In an embodiment, the hole area 120 may have a substantially circular shape in a plan view. However, the present invention is not limited thereto, and in another embodiment, the hole area 120 may have various planar shape such as a polygonal shape, or the like.

The peripheral area 130 may be adjacent to the display area 110 and the hole area 120. In an embodiment, the peripheral area 130 may surround the display area 110 and the hole area 120. The peripheral area 130 may be spaced apart from the hole area 120 with the display area 110 in between. Circuits, wirings, and the like configured to drive the display area 110 may be disposed in the peripheral area 130. The peripheral area 130 may be a non-display area from which an image is not displayed.

As illustrated in FIG. 2, the display module 100 may include a display panel 600, a polarization layer 700, an adhesive layer 800, a protective layer 900, and a functional layer 1000.

The display module 100 may have flexible characteristics in which each of the display panel 600, the polarization layer 700, the adhesive layer 800, the protective layer 900, and the functional layer 1000 have flexible characteristics. The display module 100 may be curved, bent, folded, or rolled.

The display panel 600 may include a plurality of pixels. The display panel 600 may generate an image formed by combining light beams emitted from the pixels, and may display the image toward the window 200, e.g., in a direction above the display panel 600.

Figure 3:
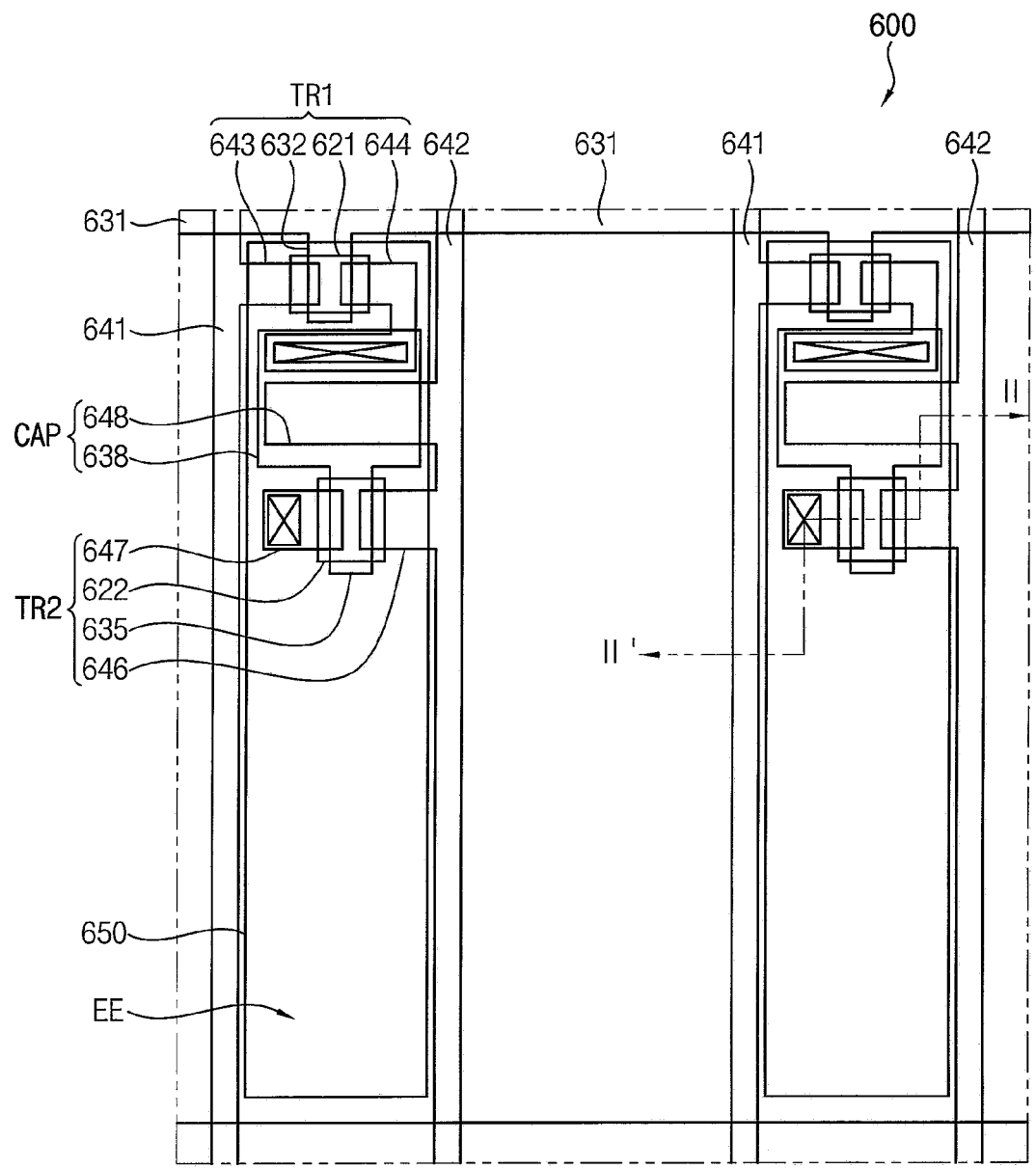
FIG. 3 is a plan view illustrating a portion of a display panel according to embodiments described herein.
Figure 4:
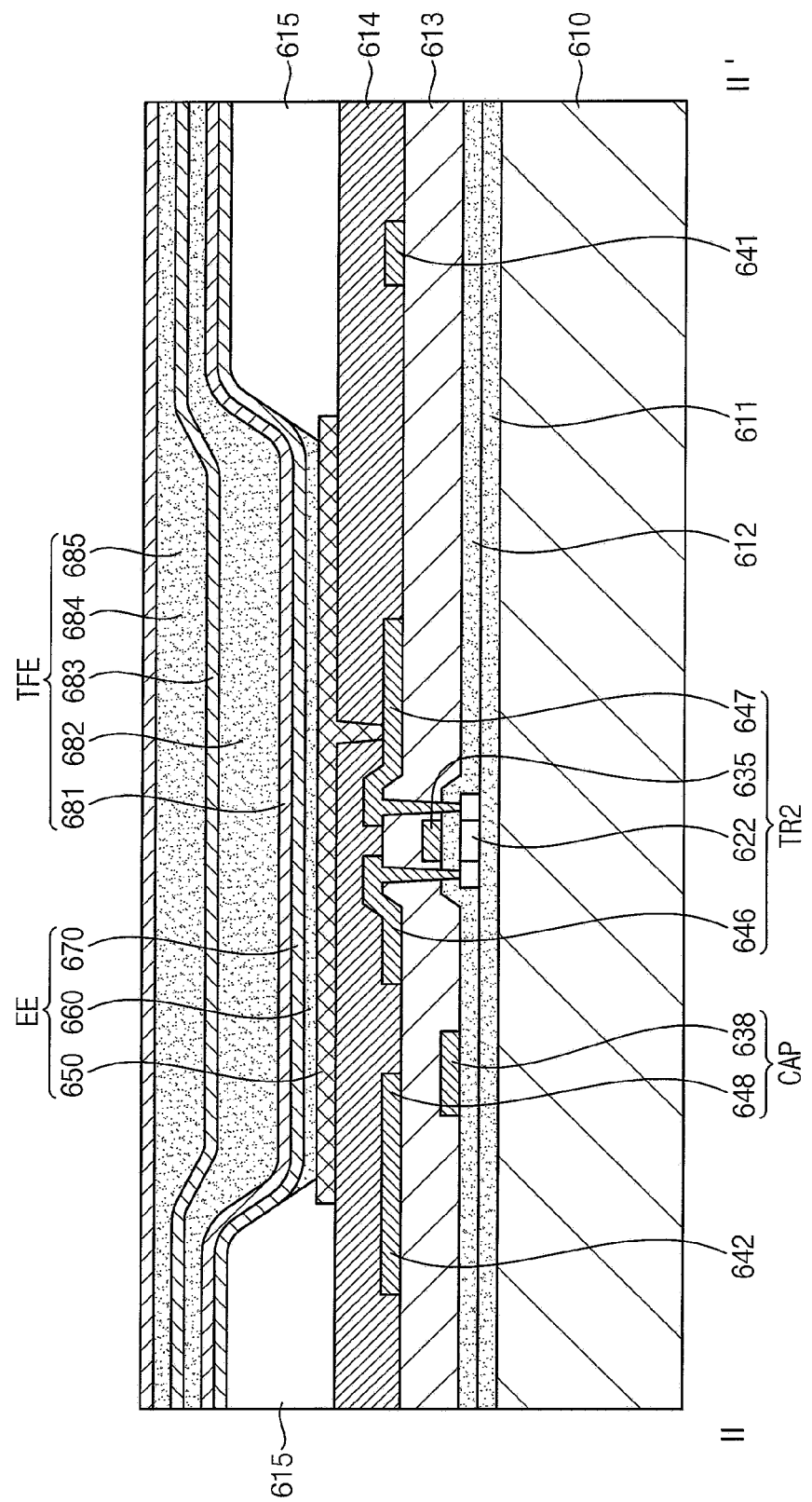
FIG. 4 is a cross-sectional view taken along a line II-IF in FIG. 3.

FIG. 3 is a plan view illustrating a portion of a display panel 600 according to embodiments described herein. FIG. 4 is a cross-sectional view taken along a line II-IF in FIG. 3.

Referring to FIGS. 3 and 4, the display panel 600 may include a plurality of pixels in which each of the pixels includes a switching thin film transistor TR1, a driving thin film transistor TR2, a capacitor CAP, and a light emitting device EE. FIG. 4 illustrates cross-sectional aspects of TR2 that are also present in TR1 though not illustrated.

Although FIGS. 3 and 4 illustrate that two thin film transistors and one capacitor are disposed in one pixel, the present invention is not limited thereto, and one pixel may be provided with at least three thin film transistors and/or at least two capacitors.

The display panel 600 may include a substrate 610, a gate line 631 disposed on the substrate 610, a data line 641 insulated from and intersected with the gate line 631, and a common power line 642. In general, one pixel may be defined by a boundary between the gate line 631, the data line 641, and the common power line 642, but the pixel is not limited to the above-described definition. The pixel may be defined by a black matrix or a pixel defining layer.

The substrate 610 may include a flexible material such as plastic. For example, the substrate 610 may be formed of polyethersulfone (PES), polycarbonate (PC), polyimide (PI), polyethylene terephthalate (PET), polyethylene naphthalate (PEN), polyacrylate (PAR), fiber reinforced plastic (FRP), or the like.

The substrate 610 may have a thickness of about 5 μm to about 200 When the substrate 610 has a thickness less than about 5 it may be difficult for the substrate 610 to stably support the light emitting device EE. In addition, when the substrate 610 has a thickness greater than about 200 the flexible characteristics of the substrate 610 may be lessened.

A buffer layer 611 may be disposed on the substrate 610. The buffer layer 611 may prevent penetration of impurities and planarize a surface above the substrate 610. The buffer layer 611 may be formed of silicon nitride, silicon oxide, silicon oxynitride, or the like. However, the buffer layer 611 is not necessarily required, and may be omitted according to a type of the substrate 610 and processing conditions.

A switching semiconductor layer 621 (illustrated in FIG. 3) and a driving semiconductor layer 622 may be disposed on the buffer layer 611. The switching semiconductor layer 621 and the driving semiconductor layer 622 may be formed of one of oxide semiconductors such as polycrystalline silicon, amorphous silicon, and indium gallium zinc oxide (IGZO), and indium zinc tin oxide (IZTO). For example, when the driving semiconductor layer 622 is formed of polycrystalline silicon, the driving semiconductor layer 622 may include a channel region that is not doped with impurities, and a source region and a drain region that are formed by doping impurities on both sides of the channel region. In this case, the doped impurities are P-type impurities such as boron (B), and $B_2H_6$ may be mainly used. The impurities may vary depending on the type of thin film transistor. Although the thin film transistor having a PMOS structure using the P-type impurities is used as the driving thin film transistor TR2 in this embodiment, the driving thin film transistor TR2 is not limited thereto, and a thin film transistor having an NMOS structure or a CMOS structure may be used as the driving thin film transistor TR2.

A gate insulating layer 612 may be disposed on the switching semiconductor layer 621 and the driving semiconductor layer 622. The gate insulating layer 612 may be formed of tetraethoxysilane (TEOS), silicon nitride, silicon oxide, or the like. In one embodiment, the gate insulating layer 612 may have a double-film structure in which a silicon nitride film having a thickness of about 40 nm and a tetraethoxysilane film having a thickness of about 80 nm are sequentially laminated.

A gate wiring may include gate electrodes 632 (illustrated in FIG. 3) and 635 that are disposed on the gate insulating layer 612. The gate wiring may further include the gate line 631 (illustrated in FIG. 3), a first power storage plate 638, and the like. The gate electrodes 632 and 635 may be disposed to overlap at least a part (such as the channel region) of the semiconductor layers 621 and 622. When impurities are doped in the source region and the drain region of the semiconductor layers 621 and 622 in the process of forming the semiconductor layers 621 and 622, the gate electrodes 632 and 635 may serve to block the impurities from being doped into the channel region.

The gate electrodes 632 and 635 and the first power storage plate 638 may be disposed on the same layer atop the gate insulation layer 612, and may be formed of substantially the same metal. For example, the gate electrodes 632 and 635 and the first power storage plate 638 may be formed of molybdenum (Mo), chromium (Cr), tungsten (W), or the like.

An interlayer insulating layer 613 covers the gate electrodes 632 and 635 and is disposed on the gate insulating layer 612. Like the gate insulating layer 612, the interlayer insulating layer 613 may be formed of tetraethoxysilane, silicon nitride, silicon oxide, or the like, but the material of the interlayer insulating layer 613 is not limited thereto.

Data wirings including source electrodes 643 (illustrated in FIG. 3) and 646 and drain electrodes 644 (illustrated in FIG. 3) and 647 are disposed on the interlayer insulating layer 613. The data wiring may further include the data line 641, the common power line 642, a second power storage plate 648, and the like. The source electrodes 643 and 646 and the drain electrodes 644 and 647 may be connected to the source region and the drain region of the semiconductor layers 621 and 622 through contact holes formed in the gate insulating layer 612 and the interlayer insulating layer 613, respectively.

The switching thin film transistor TR1 may include a switching semiconductor layer 621, a switching gate electrode 632, a switching source electrode 643, and a switching drain electrode 644. The driving thin film transistor TR2 may include a driving semiconductor layer 622, a driving gate electrode 635, a driving source electrode 646, and a driving drain electrode 647. In addition, the capacitor CAP may include the first power storage plate 638 and the second power storage plate 648 that are disposed with the interlayer insulating layer 613 therebetween.

The switching thin film transistor TR1 may be used as a switching device to select a pixel configured to emit light. The switching gate electrode 632 may be connected to the gate line 631. The switching source electrode 643 may be connected to the data line 641. The switching drain electrode 644 may be spaced apart from the switching source electrode 643 and connected to the first power storage plate 638.

The light emitting device EE may include a pixel electrode 650, light emitting layer 660, and common electrode 670. The driving thin film transistor TR2 may apply a driving power through the drain electrode 647, which allows the light emitting layer 660 of the light emitting device EE in the selected pixel to receive power from the pixel electrode 650. The driving gate electrode 635 may be connected to the first power storage plate 638. The driving source electrode 646 and the second power storage plate 648 may be connected to the common power line 642. The driving drain electrode 647 may be connected to the pixel electrode 650 of the light emitting device EE through a contact hole.

According to the above structure, the switching thin film transistor TR1 may be operated by a gate voltage applied to the gate line 631, thereby serving to transfer the data voltage applied to the data line 641 to the driving thin film transistor TR2. A voltage corresponding to a difference between the common voltage applied from the common power line 642 to the driving thin film transistor TR2 and the data voltage transferred from the switching thin film transistor TR1 may be stored in the capacitor CAP. A current corresponding to the voltage stored in the capacitor CAP flows into the light emitting device EE through the driving thin film transistor TR2, so that the light emitting device EE may emit light.

A planarization layer 614 may be disposed on the interlayer insulating layer 613 to cover the data lines patterned on the same layer as the data line 641, the common power line 642, the source electrodes 643 and 646, the drain electrodes 644 and 647, and the second power storage plate 648. The common power line 642 and the second power storage plate 648 may share a same node.

The planarization layer 614 may serve to remove and planarize steps or inconsistencies in order to increase a luminance efficiency of the light emitting device EE formed thereon. The planarization film 614 may be formed of acrylic-based resin (polyacrylates resin), epoxy resin, phenolic resins, polyamide-based resin, polyimide-based resin, unsaturated polyester-based resin, polyphenylene-based resin, polyphenylene sulfide-based resin, benzocyclobutene (BCB), or the like.

The pixel electrode 650 of the light emitting device EE may be disposed on the planarization layer 614. The pixel electrode 650 may be connected to the drain electrode 647 through a contact hole formed in the planarization layer 614.

A pixel defining layer 615 may be disposed on the planarization layer 614 to expose at least a part of the pixel electrode 650 and set out a pixel region. The pixel electrode 650 may correspond to the pixel region of the pixel defining layer 615. The pixel defining layer 615 includes a thick raised portion that slopes into a cavity region. The pixel region may lay within the cavity region. The pixel defining layer 615 may be formed of polyacrylate-based resin, polyimide-based resin, or the like.

The light emitting layer 660 may be disposed on the pixel electrode 650 and be present within the pixel region. The light emitting layer 660 may be in contact with the lower pixel electrode 650, the upper common electrode 670, and laterally with the pixel defining layer 615. The common electrode 670 may be disposed on the pixel defining layer 615 and the light emitting layer 660. The light emitting layer 660 may be formed of a low molecular organic material or a high molecular organic material. At least one of a hole injection layer (HIL) and a hole transport layer (HTL) may be further disposed between the pixel electrode 650 and the light emitting layer 660, and at least one of an electron transport layer (ETL) and an electron injection layer (EIL) may be further disposed between the light emitting layer 660 and the common electrode 670. The HIL, HTL, EIL, and ETL layers are not illustrated.

Each of the pixel electrode 650 and the common electrode 670 may be formed as any one of a transmissive electrode, a transflective electrode, and a reflective electrode.

Transparent conductive oxide (TCO) may be used to form the transmissive electrode. The transparent conductive oxide (TCO) may include indium tin oxide (ITO), indium zinc oxide (IZO), zinc oxide (ZnO), indium oxide ($In_2O_3$), and the like.

In order to form the transflective electrode and the reflective electrode, metal such as magnesium (Mg), silver (Ag), gold (Au), calcium (Ca), lithium (Li), chromium (Cr), aluminum (Al), copper (Cu), or an alloy thereof may be used. A determination between the transflective electrode and the reflective electrode may depend thicknesses thereof. In general, the transflective electrode may have a thickness of about 200 nm or less, and the reflective electrode may have a thickness of about 300 nm or more. The transflective electrode may have a higher light transmittance than the reflective electrode but have a higher resistance as the thickness decreases, and may have a lower light transmittance as the thickness increases. In addition, the transflective electrode and the reflective electrode may be formed in a multilayer structure including a metal layer formed of metal or a metal alloy and a transparent conductive oxide layer laminated on the metal layer.

A thin film encapsulation layer TFE may be disposed on the common electrode 670. The thin film encapsulation layer TFE may include at least one inorganic film 681, 683, and 685, and at least one organic film 682 and 684. The thin film encapsulation layer TFE may have a structure in which the inorganic films 681, 683 and 685 and organic films 682 and 684 are alternately laminated. As illustrated in FIG. 4, the inorganic film 681 may be disposed at the bottom. Thus, the inorganic film may be disposed most adjacent to the light emitting device EE.

Although FIG. 4 illustrates that the thin film encapsulation layer TFE includes three inorganic films 681, 683 and 685 and two organic films 682 and 684, the present invention is not limited thereto.

The inorganic films 681, 683 and 685 may be formed of at least one inorganic material of $Al_2O_3$, $TiO_2$, $ZrO$, $SiO_2$, AlON, AlN, SiON, $Si_3N_4$, ZnO, and $Ta_2O_5$. The inorganic films 681, 683 and 685 may be formed through chemical vapor deposition (CVD) or atomic layer deposition (ALD). The inorganic films 681, 683 and 685 may mainly block the penetration of moisture or oxygen. The inorganic films 681, 683 and 685 may block most of the moisture and oxygen from penetrating into the light emitting device (EE).

The organic films 682 and 684 may be formed of a polymer-based material. The polymer-based material may include acrylate-based resin, epoxy-based resin, polyimide, polyethylene, and the like. In addition, the organic films 682 and 684 may be formed through a thermal deposition process. The thermal deposition process for forming the organic films 682 and 684 may be performed within a temperature range that does not damage the light emitting device EE.

The thin film encapsulation layer TFE may have a thickness of about 10 μm or less. Accordingly, the overall thickness of the display panel 600 may be formed to be very thin. As such, the thin film encapsulation layer TFE is disposed on the light emitting device EE, so that the flexible characteristics of the display panel 600 may be maximized.

Referring to FIGS. 1 and 2, the polarization layer 700 may be disposed on the display panel 600. The polarization layer 700 may reduce a reflection of external light of the display device 101. For example, when external light passes through the polarization layer 700, is reflected from a lower portion of the polarization layer 700 (for example, the display panel 600), and passes back through the polarization layer 700 again, the external light passes through the polarization layer 700 twice, with a result that a phase of the external light may be changed. Accordingly, the phase of the reflected light may be different from the phase of the incident light entering the polarization layer 700. The difference in phase may bring about a destructive interference, a decrease in the reflection of external light, resulting in an improvement of the visibility of the display device.

The adhesive layer 800 may be disposed between the polarization layer 700 and the window 200. The adhesive layer 800 may serve to attach the window 200 to the display module 100. In an embodiment, the adhesive layer 800 may include pressure sensitive adhesive (PSA), optically clear adhesive (OCA), or the like.

The protective layer 900 of the display module 100 may be disposed under the display panel 600. In other words, the protective layer 900 may be spaced apart from the polarization layer 700 with the display panel 600 there between. The protective layer 900 may serve to protect a lower surface of the display panel 600 during a manufacturing process and while using the display device 101. In an embodiment, the protective layer 900 may include polyimide (PI), polyethylene terephthalate (PET), or the like.

The functional layer 1000 may be disposed under the protective layer 900. In other words, the functional layer 1000 may be spaced apart from the display panel 600 with the protective layer 900 there between. In an embodiment, the functional layer 1000 may include a heat dissipation layer 1010 and a cushion layer 1020.

The heat dissipation layer 1010 may serve to disperse heat and to release heat transferred from the display panel 600 to outside of the display module 100. In an embodiment, the heat dissipation layer 1010 may include metal such as copper (Cu), graphite, or the like.

The cushion layer 1020 may be disposed between the protective layer 900 and the heat dissipation layer 1010. The cushion layer 1020 may be disposed under the display panel 600, and may reduce physical impact that may otherwise be applied to the display panel 600. The cushion layer 1020 may include a polymer resin such as polypropylene (PP) or polyethylene (PE). In an embodiment, the cushion layer 1020 may include any material that has a density of about 0.5 g/cm3 or more. The cushion layer 1020 may be formed as a foam or gel. In an embodiment, the cushion layer 1020 may include a material having high elastic force, for example, rubber.

Although not illustrated in FIG. 2, in an embodiment the functional layer 1000 may further include an embossing layer to improve an adhesiveness between the functional layer 1000 and the display panel 600, a black layer to prevent elements disposed under the display panel 600 from being observed, or the like.

The window 200 may be disposed on the display module 100. The window 200 may be attached to the display module 100 by the adhesive layer 800. In an embodiment, the window 200 may include glass. However, the present invention is not limited thereto, and in another embodiment, the window 200 may include plastic.

The window 200 may include a first window area 210 and a second window area 220. The first window area 210 may overlay the hole area 120 of the display module 100, and the second window area 220 may overlap the display area 110 of the display module 100 and extend over the hole area 120.

The first window area 210 may have a diameter D210 that is smaller than a diameter D120 of the hole area 120. The second window area 220 may have a length L220 that is longer than a length L110 of the display area 110. Accordingly, the first window area 210 may be disposed inside the second window area 220, and the second window area 220 may surround the first window area 210. The first window area 210 may be within the second window area 220.

In an embodiment, the second window area 220 may be a bendable area. When the display module 100 has flexible characteristics, the display module 100 may be bent during a manufacturing process and/or when the display device 101 is in use. Accordingly, the second window area 220 may be bent along with bending of the display module 100.

The window 200 may have different thicknesses in the first window area 210 and the second window area 220. A first thickness T1 of the first window area 210 may be greater than a second thickness T2 of the second window area 220.

Accordingly, the window 200 may include a flat window portion 230, such as a planarized region that has the second thickness T2. The flat window portion 230 may extend over the display area 110 and the hole area 120. The window 200 may include a protruding window portion 240 that protrudes from the flat window portion 230 in the hole area 120. The protruding window portion 240 may protrude toward and within the hole area 120 of the display module 100. The protruding window portion 240 may have a third thickness T3 obtained by subtracting the second thickness T2 from the first thickness T1. In other words the first thickness T1 of the first window area 210 may be a combination of the second thickness T2 of the flat portion 230 and the third thickness T3 of the protruding window portion 240.

In an embodiment, the window 200 may be formed by using wet or dry etching, or mechanical processing. For example, the window 200 including the flat window portion 230 and the protruding window portion 240 protruding from the flat window portion 230 in the hole area 120 may be formed by etching or processing the second window area 220 and the first window area 210 having the first thickness T1.

In an embodiment, the second thickness T2 of the second window area 220 may be from about 10 μm to about 100 μm. When the second thickness T2 is less than about 10 μm, the strength of the second window area 220 may decrease so that the second window area 220 may be vulnerable to external impact. Further, when the second thickness T2 is greater than about 100 μm, implementation of the flexible display device may be difficult because the second window area 220 may not be easily bent.

In an embodiment, the first thickness T1 of the first window area 210 may be less than about 400 μm. When the first thickness T1 is greater than about 400 μm, a thickness of the display device may increase, and a light transmittance of the window 200 may be reduced.

As noted, the diameter D210 (also called a width or an extent) of the first window area 210 may be less than the diameter D120 (width or extent) of the hole area 120 of the display module 100. In other words, a diameter (also D210) of the protruding window portion 240 may be less than the diameter D120 of the hole area 120 of the display module 100. Accordingly, the protruding window portion 240 may be disposed inside the hole area 120 of the display module 100.

The light shielding layer 300 may be disposed between the display module 100 and the window 200. The light shielding layer 300 may be disposed adjacent the window 200, the display area 110, and the hole area 120. The light shielding layer 300 may be disposed at a boundary between the display area 110 and the hole area 120. A first portion of the light shielding layer 300 may be disposed in the hole area 120 and a second portion of the light shielding layer 300 may be disposed in the adhesive layer 800 of the display module 100. The light shielding layer 300 may be printed on a lower surface of the window 200. The light shielding layer 300 may absorb most of the external light incident on the light shielding layer 300. Accordingly, the light shielding layer 300 may prevent a reflection of external light.

In an embodiment, the light shielding layer 300 may include a black material configured to block the external light. For example, the light shielding layer 300 may be formed of chromium (Cr), chromium oxide ($CrO_x$), chromium nitride ($CrN_x$), carbon black, a pigment mixture, a dye mixture, or the like.

The functional module 400 may be disposed under the first window area 210 and spaced apart from the window 200. The functional module 400 may be spaced apart from the protruding window portion 240, and may be disposed inside the hole area 120 of the display module 100.

The functional module 400 may include a camera module configured to take a photo of (or recognize) an image of an object located in front of the display device 101, a face recognition sensor module configured to sense a face of a user, a pupil recognition sensor module configured to sense pupils of a user, an acceleration sensor module configured to determine a movement of the display device, a proximity sensor module and an infrared sensor module configured to detect proximity to a front surface of the display device, an ambient light sensor module configured to measure external brightness, or the like. The functional module 400 may sense or recognize the object or the user located in front of the display device 101 through the first window area 210

In an embodiment, the thickness T3 of the protruding window portion 240 may be less than a thickness of the display module 100. Because the thickness T3 of the protruding window portion 240 is less than the thickness of the display module 100, the functional module 400 may not be damaged by the protruding window portion 240. Both the protruding window portion 240 and the functional module 400 may be disposed inside the hole area 120 of the display module 100.

In a comparative example, a window disposed on a display module including a display area and a hole area may have a substantially uniform thickness. In such a case, a portion of the window corresponding to the display area of the display module may be robust to external impact because it is supported by elements of the display module, while a portion of the window corresponding to the hole area of the display module may be vulnerable to external impact because it is not supported by the elements of the display module.

According to embodiments described herein, the first window area 210 including the flat portion 210 and protruding window portion 240 overlaying the hole area 120 of the display module 100 may have a thickness greater than that of the second window area 220 that overlaps the display area 110 of the display module 100. As the thickness of the window 200 increases, an impact resistance of the window 200 increases. Therefore, the window 200 that may easily bend and have an improved impact resistance may be implemented because the thickness of the first window area 210 in the hole area 120 of the display module 100 is relatively large.

Figure 5:
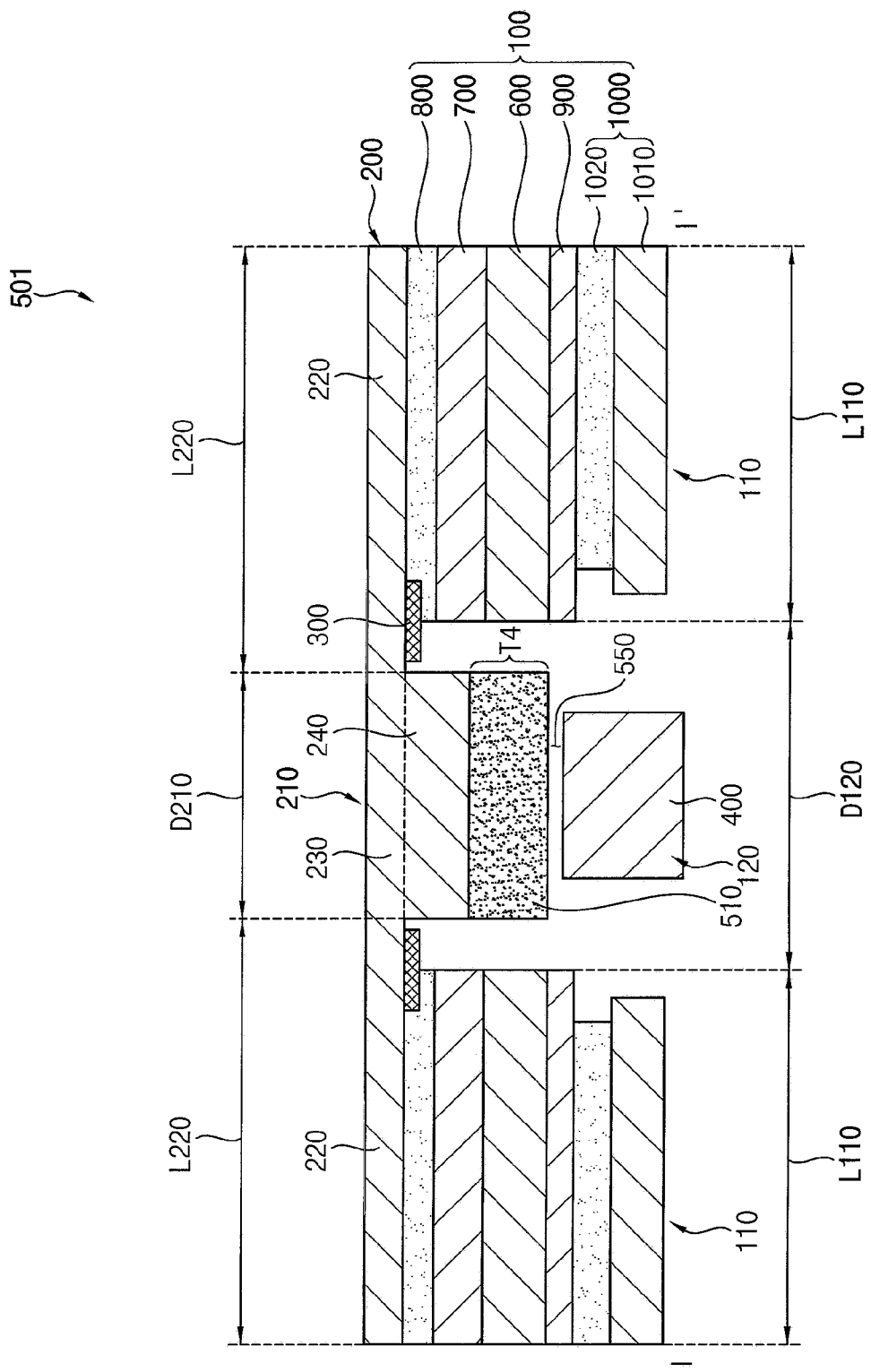
FIG. 5 is a cross-sectional view illustrating a portion of the display device according to embodiments described herein.

A display device 501 according to example embodiments will be described with reference to FIG. 5. FIG. 5 is a cross-sectional view illustrating a portion of the display device 501 according to an embodiment of the present invention.

Referring to FIG. 5, the display device 501 according to an embodiment of the present invention may include a display module 100, a window 200, a light shielding layer 300, a functional module 400, and a first impact absorbing layer 510. The display device described with reference to FIG. 5 may be substantially the same as or similar to the display device described with reference to FIG. 2 except the addition of the first impact absorbing layer 510. Therefore, descriptions of repeated elements may be omitted for brevity.

The first impact absorbing layer 510 may be disposed under the first window area 210. In other words, the first impact absorbing layer 510 may be disposed between the first window area 210 and the functional module 400. The first impact absorbing layer 510 may contact a lower surface of the protruding window portion 240, and may be spaced apart from the functional module 400 with a predetermined gap 550 in between.

The first impact absorbing layer 510 may protect the first window area 210 from external impact to the first window area 210. When the external impact applies to the first window area 210, the first impact absorbing layer 510 may properly disperse the stress applied to the first window area 210 by the external impact. Accordingly, the first impact absorbing layer 510 may alleviate the external impact applied to the first window area 210.

In an embodiment, the first impact absorbing layer 510 may include at least one of glass, polyethylene terephthalate (PET), polyimide (PI), polymethyl methacrylate (PMMA), and polycarbonate (PC). For example, the first impact absorbing layer 510 may include a material substantially same as or different from that of the window 200. The first impact absorbing layer 510 may be transparent.

In an embodiment, a thickness T4 of the first impact absorbing layer 510 may be in a range from about 10 µm to about 200 When the thickness T4 of the first impact absorbing layer 510 is less than about 10 the first impact absorbing layer 510 may not absorb a sufficient external impact. Further, when the thickness T4 of the first impact absorbing layer 510 is greater than about 200 the thickness of the display device may be excessively increased.

Figure 6:
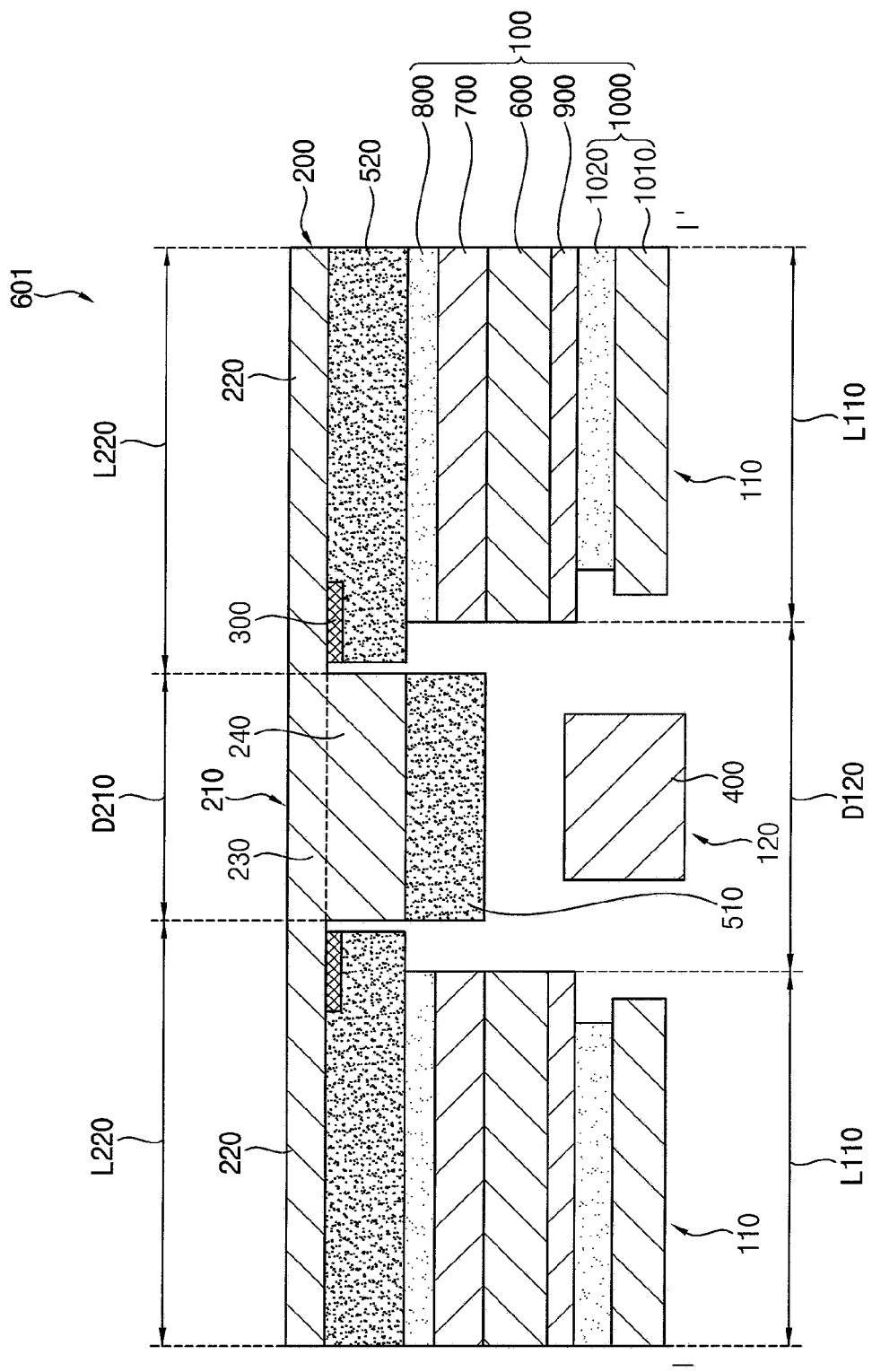
FIG. 6 is a cross-sectional view illustrating a portion of a display device according to embodiments described herein.

Hereinafter, a display device 601 according to example embodiments will be described with reference to FIG. 6. FIG. 6 is a cross-sectional view illustrating a portion of the display device 601 according to an embodiment of the present invention.

Referring to FIG. 6, the display device 601 according to example embodiments may include a display module 100, a window 200, a light shielding layer 300, a functional module 400, a first impact absorbing layer 510, and a second impact absorbing layer 520. The display device described with reference to FIG. 6 may be substantially the same as or similar to the display device described with reference to FIG. 5 except the addition of the second impact absorbing layer 520. Therefore, descriptions of repeated elements may be omitted for brevity.

The second impact absorbing layer 520 may be disposed under the second window area 220. In other words, the second impact absorbing layer 520 may be disposed between the second window area 220 and the display module 100. The second impact absorbing layer 520 may contact a lower surface of the second window area 220 and an upper surface of the adhesive layer 800.

The second impact absorbing layer 520 may protect the second window area 220 from external impact to the second window area 220. When the external impact applies to the second window area 220, the second impact absorbing layer 520 may properly disperse the stress applied to the second window area 220 by the external impact. Accordingly, the second impact absorbing layer 520 may alleviate the external impact applied to the second window area 220. A length of the second impact absorbing layer 520 may extend from the display area 110 into the hole area 120. The second impact absorbing layer 520 may extend into the hole area 120 but not physically contact the protruding window portion 240 that extends into the hole area 120.

In an embodiment, the second impact absorbing layer 520 may include at least one of glass, polyethylene terephthalate (PET), polyimide (PI), polymethyl methacrylate (PMMA), and polycarbonate (PC). For example, the second impact absorbing layer 520 may include a material substantially same as or different from that of the window 200. In an embodiment, the second impact absorbing layer 520 may include a material substantially the same as that of the first impact absorbing layer 510.

In an embodiment, a thickness of the second impact absorbing layer 520 may be in a range from about 10 µm to about 200 When the thickness of the second impact absorbing layer 520 is less than about 10 the second impact absorbing layer 520 may not sufficiently absorb the external impact. Further, when the thickness of the second impact absorbing layer 520 is greater than about 200 the thickness of the display device may be excessively increased.

In an embodiment, the light shielding layer 300 may be disposed between the window 200 and the second impact absorbing layer 520 and at a boundary between the display area 110 and the hole area 120. For example, the light shielding layer 300 may be printed on a lower surface of the window 200 or an upper surface of the second impact absorbing layer 520. The light shielding layer 300 may also be formed within the second impact absorbing layer 520.

Figure 7:
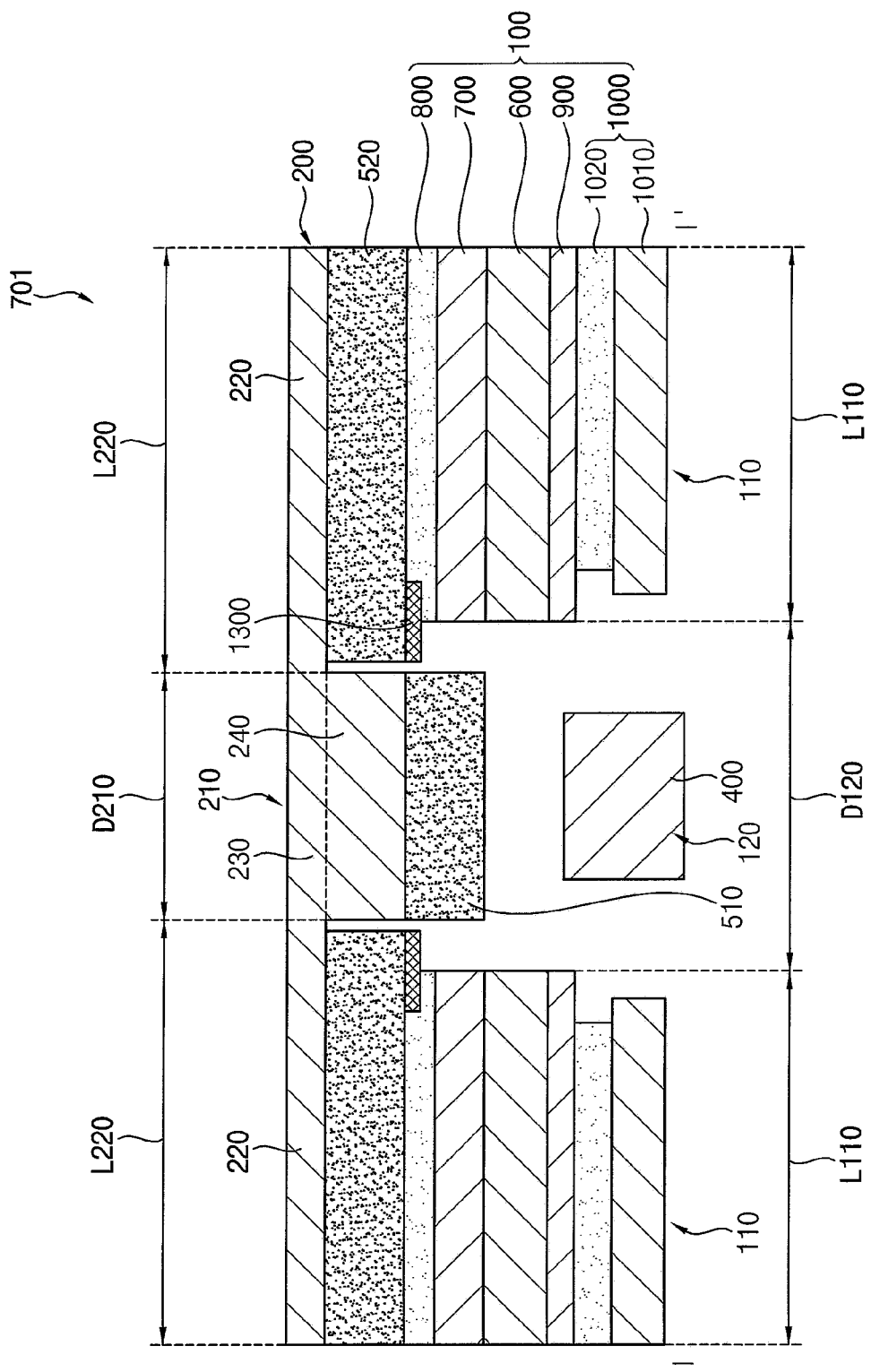
FIG. 7 is a cross-sectional view illustrating a portion of a display device according to embodiments described herein.

Hereinafter, a display device 701 according to example embodiments will be described with reference to FIG. 7. FIG. 7 is a cross-sectional view illustrating a portion of the display device 701 according to an embodiment of the present invention.

Referring to FIG. 7, the display device 701 according to example embodiments may include a display module 100, a window 200, a light shielding layer 1300, a functional module 400, a first impact absorbing layer 510, and a second impact absorbing layer 520. The display device described with reference to FIG. 7 may be substantially the same as or similar to the display device described with reference to FIG. 6 except the position of the light shielding layer 1300. Therefore, descriptions of repeated elements may be omitted for brevity.

In an embodiment, the light shielding layer 1300 may be disposed between the display module 100 and the second impact absorbing layer 520 and at a boundary between the display area 110 and the hole area 120. For example, the light shielding layer 1300 may be printed on a lower surface of the second impact absorbing layer 520. The light shielding layer 1300 may extend partially into the adhesive layer 800 of the display module 100 and partially into the hole area 120.

The display device according to the embodiments may be applied to a display device included in a computer, a notebook, a mobile phone, a smartphone, a smart pad, a PMP, a PDA, an MP3 player, or the like.

Although the display device according to the embodiments have been described with reference to the drawings, the illustrated embodiments are examples, and may be modified and changed by a person having ordinary knowledge in the relevant technical field without departing from the technical spirit described in the following claims.

Some of the advantages that may be achieved by exemplary implementations/embodiments of the invention and/or exemplary methods of the invention include increased robustness of a display device.

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A display device comprising:
a display module including a display area from which an image is displayed and a hole area disposed inside the display area; and
a window disposed on the display module and including a first window area overlaying the hole area and a second window area overlapping the display area,
wherein a first thickness of the first window area is greater than a second thickness of the second window area.

2. The display device of claim 1, wherein the display area surrounds the hole area.

3. The display device of claim 1, wherein the first thickness is less than 400 μm.

4. The display device of claim 1, wherein the second thickness is from 10 μm to 100 μm.

5. The display device of claim 1, wherein the window includes glass.

6. The display device of claim 1, wherein the second window area is bendable.

7. The display device of claim 1, wherein a width of the first window area is less than a width of the hole area of the display module.

8. The display device of claim 1, further comprising:
a light shielding layer disposed between the display module and the window and at a boundary between the display area and the hole area.

9. The display device of claim 1, further comprising:
a functional module disposed under the first window area and spaced apart from the window.

10. The display device of claim 1, further comprising:
a first impact absorbing layer disposed under the first window area.

11. The display device of claim 10, wherein the first impact absorbing layer includes at least one of glass, polyethylene terephthalate (PET), polyimide (PI), polymethyl methacrylate (PMMA), and polycarbonate (PC).

12. The display device of claim 10, further comprising:
a second impact absorbing layer disposed between the second window area and the display module.

13. The display device of claim 12, wherein the second impact absorbing layer includes a same material as that of the first impact absorbing layer.

14. The display device of claim 12, further comprising:
a light shielding layer disposed between the display module and the second impact absorbing layer and at a boundary between the display area and the hole area.

15. The display device of claim 1, wherein the display module includes a display panel and a polarization layer disposed between the display panel and the window.

16. The display device of claim 15, wherein the display module further includes a heat dissipation layer disposed under the display panel and a cushion layer disposed between the heat dissipation layer and the display panel.

17. The display device of claim 16, wherein the display module further includes a protective layer disposed between the display panel and the cushion layer.

18. A display device comprising:
a display module including a display area from which an image is displayed and a hole area disposed inside the display area; and
a window disposed on the display module and including a flat portion having a uniform thickness and a protruding portion protruding from the flat portion toward the hole area of the display module.

19. The display device of claim 18, wherein a thickness of the protruding portion is less than a thickness of the display module.

20. The display device of claim 18, wherein a width of the protruding portion of the window is less than a width of the hole area of the display module.

* * * * *